(12) United States Patent
Lee

(10) Patent No.: US 12,300,707 B2
(45) Date of Patent: May 13, 2025

(54) IMAGE SENSING DEVICE

(71) Applicant: SK hynix Inc., Icheon-si (KR)

(72) Inventor: Jae Won Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 566 days.

(21) Appl. No.: 17/499,698

(22) Filed: Oct. 12, 2021

(65) Prior Publication Data

US 2022/0165760 A1 May 26, 2022

(30) Foreign Application Priority Data

Nov. 25, 2020 (KR) .......................... 10-2020-0159666

(51) Int. Cl.
*H01L 27/146* (2006.01)
*H04N 25/77* (2023.01)

(52) U.S. Cl.
CPC .... *H01L 27/1461* (2013.01); *H01L 27/14627* (2013.01); *H04N 25/77* (2023.01)

(58) Field of Classification Search
CPC .......... H01L 27/1461; H01L 27/14627; H04N 25/77
See application file for complete search history.

(56) References Cited

U.S. PATENT DOCUMENTS

| | | | |
|---|---|---|---|
| 9,893,117 B2 | 2/2018 | Meynants et al. | |
| 2009/0166684 A1* | 7/2009 | Yahav | H01L 27/1461 |
| | | | 257/431 |
| 2010/0148289 A1 | 6/2010 | McCarten | |
| 2010/0327390 A1* | 12/2010 | McCarten | H01L 27/1463 |
| | | | 257/E31.093 |
| 2015/0311240 A1 | 10/2015 | Cohen et al. | |
| 2017/0194367 A1 | 7/2017 | Fotopoulou et al. | |
| 2019/0214428 A1 | 7/2019 | Nagaraja et al. | |
| 2019/0342510 A1 | 11/2019 | Sano | |
| 2020/0028017 A1* | 1/2020 | Imoto | H01L 31/02002 |
| 2021/0175264 A1* | 6/2021 | Kawahito | H01L 27/14603 |

FOREIGN PATENT DOCUMENTS

| | | |
|---|---|---|
| CN | 103299437 A | 9/2013 |
| CN | 206212153 U | 5/2017 |
| CN | 3193369 A | 7/2017 |

(Continued)

OTHER PUBLICATIONS

Second Office Action mailed on May 21, 2024 for CN Appl. No. 202111169622.3, 21 pages with English translation.

(Continued)

*Primary Examiner* — Christine A Enad
(74) *Attorney, Agent, or Firm* — Perkins Coie LLP

(57) ABSTRACT

An image sensing device includes a substrate including a front side and a back side that are opposite to each other, wherein the image sensing device is structured to operate by receiving incident light through the back side of the substrate; a depletion region disposed in the substrate to be in contact with the back side of the substrate; an epitaxial layer disposed in the substrate to be in contact with or near the front side of the substrate; and a plurality of detection structures disposed in the epitaxial layer, each configured to capture photocharge generated by incident light and move by a current flowing in the epitaxial layer.

16 Claims, 13 Drawing Sheets

(56) References Cited

FOREIGN PATENT DOCUMENTS

| | | |
|---|---|---|
| CN | 110729315 A | 1/2020 |
| CN | 110739324 A | 1/2020 |
| CN | 111312734 A | 6/2020 |
| CN | 111564459 A | 8/2020 |
| EP | 3723133 A1 | 10/2020 |
| JP | 2009008537 A | 1/2009 |
| JP | 2011171749 A | 9/2011 |
| WO | 2018221261 A1 | 12/2018 |

OTHER PUBLICATIONS

Chinese Patent Office, First Office Action for CN Appl. No. 202111169622.3, mailed Dec. 6, 2023, 16 pages with English translation.

Notice to Grant Patent Right for Invention for CN Appl. No. 202111169622.3, mailed on Sep. 27, 2024, 6 pages with English translation.

\* cited by examiner

IMAGE SENSING DEVICE

PRIORITY CLAIM AND CROSS-REFERENCE TO RELATED APPLICATION

This patent document claims the priority and benefits of Korean patent application No. 10-2020-0159666, filed on Nov. 25, 2020, the disclosure of which is incorporated herein by reference in its entirety as part of the disclosure of this patent document.

TECHNICAL FIELD

The technology and implementations disclosed in this patent document generally relate to an image sensing device for sensing a distance to a target object.

BACKGROUND

An image sensing device is a device for capturing optical images by converting light into electrical signals using a photosensitive semiconductor material which reacts to light. With the development of automotive, medical, computer and communication industries, the demand for high-performance image sensing devices is increasing in various fields such as smart phones, digital cameras, game machines, IOT (Internet of Things), robots, security cameras and medical micro cameras.

The image sensing device may be roughly divided into CCD (Charge Coupled Device) image sensing devices and CMOS (Complementary Metal Oxide Semiconductor) image sensing devices. The CCD image sensing devices offer a better image quality, but they tend to consume more power and are larger as compared to the CMOS image sensing devices. The CMOS image sensing devices are smaller in size and consume less power than the CCD image sensing devices. Furthermore, CMOS sensors are fabricated using the CMOS fabrication technology, and thus photosensitive elements and other signal processing circuitry can be integrated into a single chip, enabling the production of miniaturized image sensing devices at a lower cost. For these reasons, CMOS image sensing devices are being developed for many applications including mobile devices.

SUMMARY

Various embodiments of the disclosed technology relate to an image sensing device provided with a Time of Flight (TOF) pixel having improved performance.

In accordance with an embodiment of the disclosed technology, an image sensing device is provided to include a substrate including a front side and a back side that are opposite to each other, wherein the image sensing device is structured to operate by receiving incident light through the back side of the substrate; a depletion region disposed in the substrate to be in contact with the back side of the substrate; an epitaxial layer disposed in the substrate to be in contact with or near the front side of the substrate; and a plurality of detection structures disposed in the epitaxial layer, each configured to capture photocharge generated by incident light and move by a current flowing in the epitaxial layer.

In accordance with an embodiment of the disclosed technology, an image sensing device a depletion region having a first side and a second side that are opposite to each other, wherein light is incident on the first side of the depletion region; and an epitaxial layer disposed to be contact with the second side of the depletion region and comprising: 1) a plurality of control nodes configured to respectively receive different control signals and generate a current due to a difference between the different control signals; and 2) a plurality of detection nodes disposed to respectively correspond to the plurality of control nodes, each configured to capture photocharges that are generated by incident light and move by the current.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Hereafter, various embodiments will be described with reference to the accompanying drawings. However, it should be understood that the present disclosure is not limited to specific embodiments, but includes various modifications, equivalents and/or alternatives of the embodiments. The embodiments of the present disclosure may provide a variety of effects capable of being directly or indirectly recognized through the present disclosure.

Technologies of measuring a depth (e.g., a distance to a target object) using an image sensor have been being developed through much research, and demand for the technologies of measuring the depth have been increasing in various devices such as security devices, medical devices, vehicles, game machines, virtual reality (VR)/augmented reality AR devices, and mobile device. Examples of methods of measuring a depth may include triangulation, ToF (Time of Flight) and interferometry. Among the above-mentioned depth measurement methods, the time of flight (ToF) method becomes popular because of its wide range of utilization, high processing speed, and cost advantages. The TOF method measures a distance using emitted light and reflected light. The TOF method may be roughly classified into a direct method and an indirect method, depending on whether it is a round-trip time or the phase difference that determines the distance. The direct method may measure a distance by calculating a round trip time and the indirect method may measure a distance using a phase difference. Since the direct method is suitable for measuring a long distance, the direct method is widely used in automobiles. The indirect method is suitable for measuring a short distance and thus widely used in various higher-speed devices designed to operate at a higher speed, for example, game consoles or mobile cameras. As compared to the direct type TOF systems, the indirect method has several advantages including having a simpler circuitry, low memory requirement, and a relatively lower cost.

A CAPD (Current-Assisted Photonic Demodulator) method is one type of pixel circuitry used in an indirect TOF sensor. In CAPD, electrons are generated in a pixel circuit by a majority carrier current that is created through an application of a substrate voltage, and the generated electrons are detected by using a potential difference between electric fields. Since the majority carrier current is used, the CAPD can rapidly detect electrons. In addition, the CAPD has an excellent efficiency by detecting some electrons formed at a deep depth.

Figure 1:
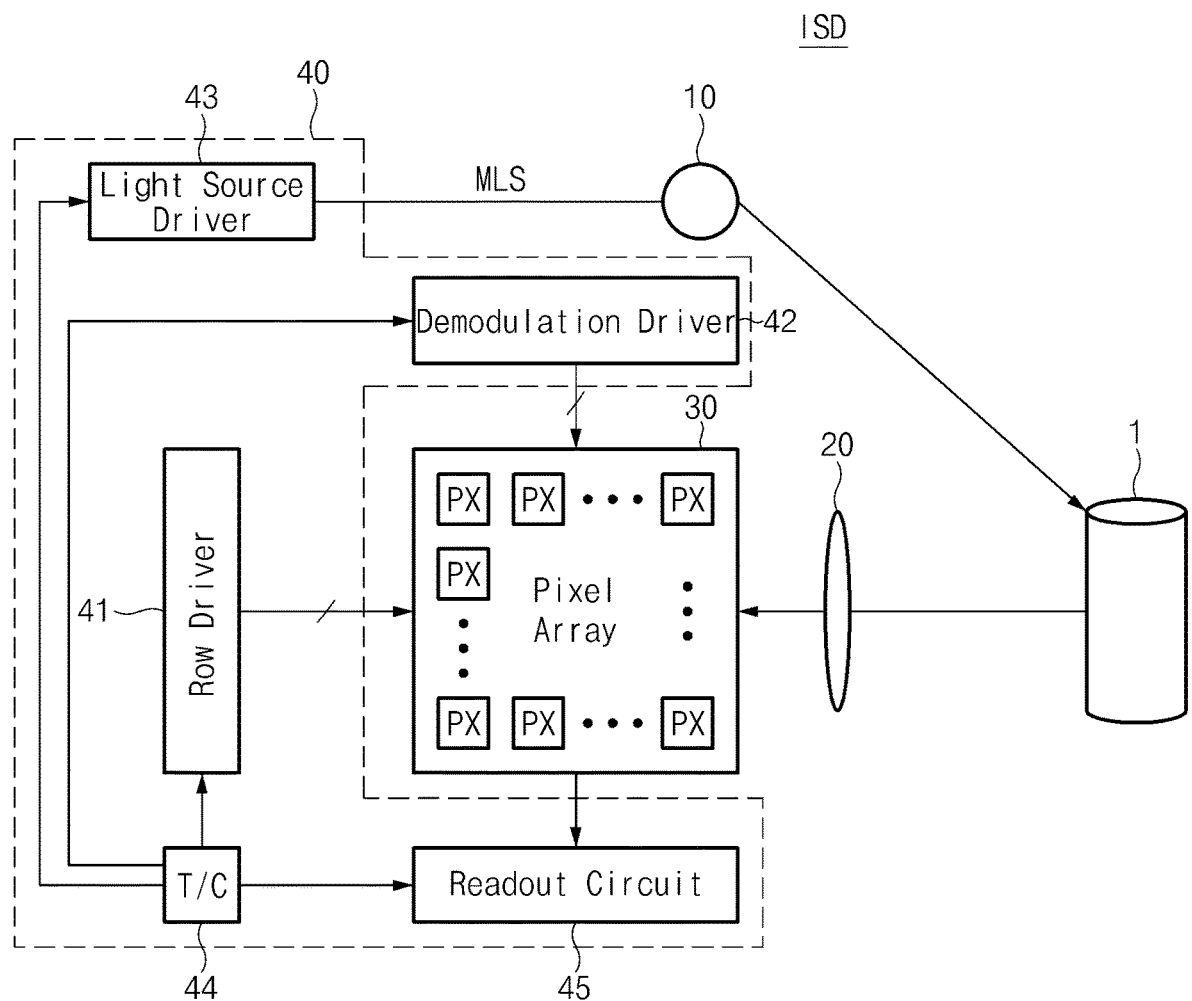
FIG. 1 is a schematic diagram illustrating an example of an image sensing device based on some implementations of the disclosed technology.

FIG. 1 is a block diagram illustrating an example of an image sensing device ISD based on some implementations of the disclosed technology.

Referring to FIG. 1, the image sensing device ISD may measure the distance to a target object 1 using the Time of Flight (TOF) principle. The TOF method may be mainly classified into a direct TOF method and an indirect TOF method. The direct TOF method may measure a time duration in which light is reflected from the target object 1 and returns to the image sensing device ISD after the light has been emitted from a light source toward the target object 1, such that the direct TOF method may calculate the distance to the target object 1 using the measured time duration. The indirect TOF method may emit modulated light to the target object 1, may sense light reflected from the target object 1, may calculate a phase difference between the modulated light and the reflected light, and may thus indirectly measure the distance between the image sensing device ISD and the target object 1. Although the image sensing device ISD using the indirect TOF method is described in this patent document, other implementations are also possible.

The image sensing device ISD may include a light source 10, a lens module 20, a pixel array 30, and a control block 40.

The light source 10 emits light onto the target object 1 in response to a light modulation signal MLS received from the control block 40 as a control signal which is fed into the light source 10 to cause light modulation in the light emitted by the light source for illuminating the target object 1. The light source 10 may be an LD (laser Diode) or LED (Light Emitting Diode) which emits a specific wavelength range of light (for example, near-infrared light, infrared light or visible light), NIR (Near Infrared Laser), a point light source, a white lamp, a monochromatic light source having monochromators combined therein, or a combination of other laser light sources. For example, the light source 10 may emit infrared light having a wavelength of 800 nm to 1,000 nm. The light emitted from the light source 10 may be modulated at a predetermined frequency in response to the light modulation signal MLS. FIG. 1 illustrates only one light source 10, for convenience of description. However, a plurality of light sources may be arranged around the lens module 20.

The lens module 20 may collect light reflected from the target object 1 and focus the collected light on pixels PX of the pixel array 30. For example, the lens module 20 may include a focusing lens with a glass or plastic surface or a cylindrical optical element. The lens module 20 may include a plurality of lenses aligned with an optical axis.

The pixel array 30 may include a plurality of unit pixels PX which are successively arranged in a 2D matrix, for example, a plurality of unit pixels PX which are successively arranged in column and row directions. The unit pixels PX may be formed on a semiconductor substrate, and each of the unit pixels PX may convert light that is incident through the lens module 20 into an electrical signal corresponding to the intensity of the light, and output the electrical signal as a pixel signal. In this case, the pixel signal may be a signal indicating the distance to the target object 1. For example, each unit pixel (PX) may be a Current-Assisted Photonic Demodulator (CAPD) pixel or a Quantum Efficiency Modulation (QEM) pixel. Although the CAPD pixel is described as an example, other implementations are also possible. Thus, the disclosed technology can also be applied to QEM pixels or any other pixels. The structure and operations of each unit pixel (PX) will hereinafter be described with reference to FIG. 2.

The control block 40 may emit light to the target object 1 by controlling the light source 10, may process each pixel signal corresponding to light reflected from the target object 1 by driving unit pixels (PXs) of the pixel array 30, and may measure the distance to the surface of the target object 1 using the processed result.

The control block 40 may include a row driver 41, a demodulation driver 42, a light source driver 43, a timing controller (T/C) 44, and a readout circuit 45.

The row driver 41 and the demodulation driver 42 may be generically called a control circuit for convenience of description.

The control circuit may drive unit pixels (PXs) of the pixel array 30 in response to a timing signal generated from the timing controller 44.

The control circuit may generate a control signal capable of selecting and controlling at least one row line from among the plurality of row lines. The control signal may include a demodulation control signal for generating a hole current in the substrate, a reset signal for controlling a reset transistor, a transmission (Tx) signal for controlling transmission of photocharges accumulated in a detection node, a floating diffusion (FD) signal for providing additional electrostatic capacity at a high illuminance level, a selection signal for controlling a selection transistor and/or others. The pixel current may refer to a current for moving photocharges generated by the substrate to the detection node.

In some implementations, the row driver 41 may generate a reset signal, a transmission (Tx) signal, a floating diffusion (FD) signal, and a selection signal, and the demodulation driver 42 may generate a demodulation control signal. Although the row driver 41 and the demodulation driver 42 based on some implementations of the disclosed technology are configured independently of each other, the row driver 41 and the demodulation driver 42 based on some other implementations may be implemented as one constituent element that can be disposed at one side of the pixel array 30 as needed.

The light source driver 43 may generate the light modulation signal MILS capable of driving the light source 10, under control of the timing controller 44. The light modulation signal MLS may be a signal modulated at a predetermined frequency.

The timing controller 44 may generate a timing signal for controlling the operations of the row driver 41, the demodulation driver 42, the light source driver 43 and the readout circuit 45.

The readout circuit 45 may generate pixel data in the form of digital signals by processing pixel signals outputted from the pixel array 30, under control of the timing controller 44. For this operation, the readout circuit 45 may include a CDS (Correlated Double Sampler) for performing correlated double sampling on the pixel signals outputted from the pixel army 30. The readout circuit 45 may include an analog-digital converter for converting the output signals from the CDS into digital signals. Furthermore, the readout circuit 45 may include a buffer circuit for temporarily storing pixel data outputted from the analog-digital converter and outputting the pixel data to the outside under control of the timing controller 44. As the pixel array 30 is composed of CAPD pixels, each column of the pixel array 30 may include two column lines for transferring pixel signals, and components for processing pixel signals outputted from the column lines may also be provided for the respective column lines.

The light source 10 may emit light, modulated at a predetermined frequency, toward a scene captured by the image sensing device ISD, and the image sensing device ISD may sense modulated light (i.e. incident light) reflected from target objects 1 within the scene, and generate depth information on each of the unit pixels PX. The modulated light and the incident light have a time delay present therebetween, due to the distance between the image sensing device ISD and the target object 1. Such a time delay appears as a phase difference between a signal generated by the image sensing device ISD and the light modulation signal MLS for controlling the light source 10. An image processor (not illustrated) may generate a depth image containing depth information on each of the unit pixels PX by calculating a phase difference which occurs in a signal outputted from the image sensing device ISD.

Figure 2:
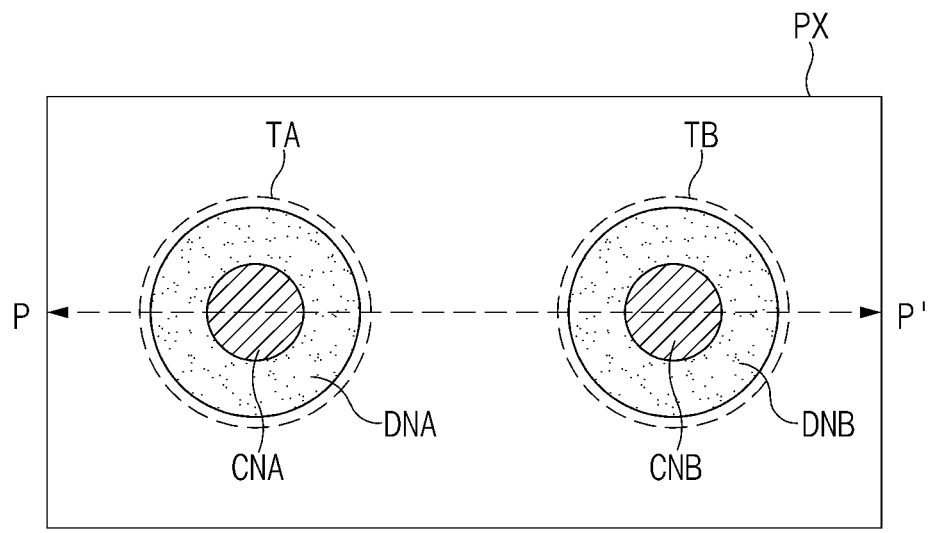
FIG. 2 is a schematic diagram illustrating an example of a layout structure of a pixel shown in FIG. 1 based on some implementations of the disclosed technology.

FIG. 2 is a schematic diagram illustrating an example of a layout structure of the pixel PX shown in FIG. 1 based on some implementations of the disclosed technology.

Referring to FIG. 2, the pixel PX may be any one of the plurality of pixels (PXs) shown in FIG. 1. Although FIG. 2 exemplarily illustrates only one pixel PX for convenience of description, the scope or spirit of the disclosed technology is not limited thereto, and substantially the same structure and operations can be applied to a certain pixel contained in the pixel array 30 as needed.

The pixel PX may include detection structures for collecting and detecting photocharge produced by the pixel. Each detection structure is referred to as a tap and includes a control node configured to receive a control signal and a detection node disposed adjacent to the control node to collect and detect photocharge generated by the pixel in response to incident light. The example in FIG. 2 shows two such taps: a first tap TA and a second tap TB. Although the disclosed technology has exemplarily disclosed two taps TA and TB contained in one pixel PX for convenience of description, other implementations are also possible. For example, at least three taps may be contained in one pixel PX. In some implementations, the plurality of taps may receive the same demodulation control signal or different demodulation control signals. The different demodulation control signals may indicate demodulation control signals received at different time points.

Although FIG. 2 shows that the first tap TA and the second tap TB are arranged in a horizontal direction (i.e., a row direction) for convenience of description, other implementations are also possible. For example, the first tap TA and the second tap TB can also be arranged in a vertical direction (i.e., a column direction) or in a diagonal direction.

The first tap TA may include a first control node CNA and a first detection node DNA surrounding the first control node CNA. Although FIG. 2 illustrates that the first control node CNA is formed in a circular shape and the first detection node DNA is formed in a ring shape, other implementations are also possible. The ring-shaped structure of the first detection node DNA may be formed to surround as large the first control node CNA as possible. The first detection node DNA formed in the ring shape can more easily capture signal carriers moving along a pixel current formed by the first control node CNA.

The first control node CNA and the first detection node DNA may be arranged to be in contact with each other, and may be physically isolated from each other using only a junction isolation through opposite doping.

In some other implementations of the disclosed technology, the first control node CNA and the first node DNA may be spaced apart from each other by a predetermined distance. In this case, the first control node CNA and the first detection node DNA may be physically isolated from each other by an insulation layer. In some implementations, the insulation layer may be formed by gap filling a trench formed by a Shallow Trench Isolation (STI) process with insulation materials.

The second tap TB may include a second control node CNB and a second detection node DNB surrounding the second control node CNB. The second control node CNB and the second detection node DNB may correspond to the first control node CNA and the first detection node DNA, respectively, and as such redundant description thereof will herein be omitted for brevity.

The structure and operations of the pixel PX will hereinafter be described with reference to the cross-sectional view of the pixel PX taken along the line P-P' shown in FIG. 2.

Figure 3:
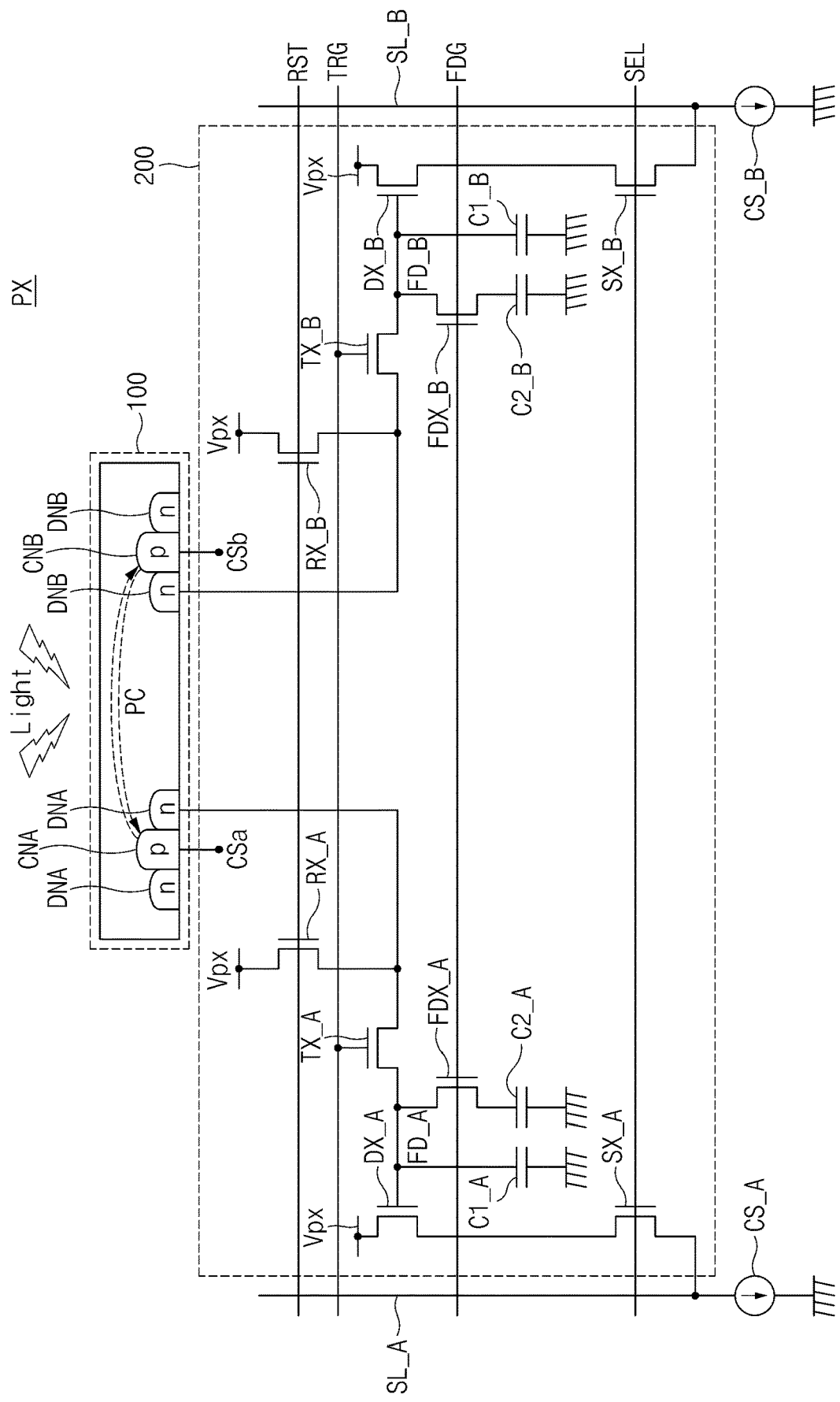
FIG. 3 is a circuit diagram illustrating an example of a pixel shown in FIG. 2 based on some implementations of the disclosed technology.

FIG. 3 is a circuit diagram illustrating an example of the pixel PX shown in FIG. 2 based on some implementations of the disclosed technology.

Referring to FIG. 3, the pixel PX may include a photoelectric conversion region 100 and a circuit region 200.

The photoelectric conversion region 100 may correspond to a region that briefly illustrates the cross-sectional view of the pixel PX taken along the line P-P' shown in FIG. 2.

The photoelectric conversion region 100 may include the first and second control nodes CNA and CNB and the first and second detection nodes DNA and DNB. The first control node CNA and the first detection node DNA may construct the first tap (or a first demodulation node), and the second control node CNB and the second detection node DNB may construct the second tap (or a second demodulation node).

The first and second control nodes CNA and CNB and the first and second detection nodes DNA and DNB may be formed in the substrate. For example, each of the first and second control nodes CNA and CNB may be a P-type impurity region, and each of the first and second detection nodes DNA and DNB may be an N-type impurity region.

The first control node CNA may receive a first demodulation control signal (CSa) from the demodulation driver 42, and the second control node CNB may receive a second demodulation control signal (CSb) from the demodulation driver 42. A potential difference between the first demodulation control signal (CSa) and the second demodulation control signal (CSb) may generate a pixel current (PC) that controls flow of signal carriers that are generated in the substrate by incident light. When the first demodulation control signal (CSa) has a higher voltage than the second demodulation control signal (CSb), the pixel current (PC) may flow from the first control node CNA to the second control node CNB. When the first demodulation control signal (CSa) has a lower voltage than the second demodulation control signal (CSb), the pixel current (PC) may flow from the second control node CNB to the first control node CNA.

Each of the first detection node DNA and the second detection node DNB may capture signal carriers moving along flow of the pixel current PC, and may accumulate the captured signal carriers.

In some implementations, the first control node CNA and the second control node CNB may each include P-type impurity regions having different doping densities. For example, the P--type impurity region (i.e., P⁻ region) having a relatively lower doping density may be implanted into the substrate to a first depth, and the P+-type impurity region (i.e., P⁺ region) having a relatively higher doping density may be implanted into the substrate to a second depth less than the first depth at the same position as the above P⁻-type impurity implantation position. In this case, the first depth may be greater than the second depth. On the other hand, the first and second detection nodes DNA and DNB may each have N-type impurity regions having different doping densities. For example, the N--type impurity region (i.e., N⁻ region) having a relatively lower doping density may be implanted into the substrate to a first depth, and the N+-type impurity region (i.e., N⁺ region) having a relatively higher doping density may be implanted into the substrate to a second depth less than the first depth at the same position as the above N⁻-type impurity implantation position.

In some implementations, the depth of the P⁻-type impurity region may be greater than the depth of the N⁻-type impurity region, thereby facilitating flow of the pixel current PC.

In some implementations, the operation of capturing photocharges of the photoelectric conversion region 100 can be performed over a first time period and a second time period following the first time period.

In the first time period, light incident upon the pixel PX may be processed by photoelectric conversion, such that a pair of an electron and a hole may occur in the substrate according to the amount of incident light. In some implementations, electrons generated in response to the amount of incident light may refer to photocharges. The demodulation driver 42 may output a first demodulation control signal to the first control node CNA, and may output a second demodulation control signal (CSb) to the second control node CNB. The first demodulation control signal (CSa) may have a higher voltage than the second demodulation control signal (CSb). The voltage of the first demodulation control signal (CSa) may be defined as an active voltage (also called an activation voltage), and the voltage of the second demodulation control signal (CSb) may be defined as an inactive voltage (also called a deactivation voltage). For example, the voltage of the first demodulation control signal (CSa) may be set to 1.2 V, and the voltage of the second demodulation control signal (CSb) may be zero volts (0V).

An electric field may occur between the first control node CNA and the second control node CNB due to a difference in voltage between the first demodulation control signal (CSa) and the second demodulation control signal (CSb), and the pixel current PC may flow from the first control node CNA to the second control node CNB. Holes in the substrate may move toward the second control node CNB, and electrons in the substrate may move toward the first control node CNA.

Electrons may be generated in the substrate in response to the amount of incident light, and the generated electrons may move toward the first control node CNA, such that the electrons may be captured by the first detection node DNA adjacent to the first control node CNA. Therefore, electrons in the substrate may be used as signal carriers for detecting the amount of incident light.

In the second time period subsequent to the first time period, light incident upon the pixel PX may be processed by photoelectric conversion, and a pair of an electron and a hole may occur in the substrate according to the amount of incident light (i.e., intensity of incident light). In this case, the demodulation driver 42 may output the first demodulation control signal (CSa) to the first control node CNA, and may output the second demodulation control signal (CSb) to the second control node CNB. Here, the first demodulation control signal (CSa) may have a lower voltage than the second demodulation control signal (CSb). In this case, the voltage of the first demodulation control signal (CSa) may hereinafter be defined as an inactive voltage (i.e., deactivation voltage), and the voltage of the second demodulation control signal (CSb) may hereinafter be defined as an active voltage (i.e., activation voltage). For example, the voltage of the first demodulation control signal (CSa) may be zero volts (0V), and the voltage of the second demodulation control signal (CSb) may be set to 1.2 V.

An electric field may occur between the first control node CNA and the second control node CNB due to a difference in voltage between the first demodulation control signal (CSa) and the second demodulation control signal (CSb), and the pixel current PC may flow from the second control node CNB to the first control node CNA. Holes in the substrate may move toward the first control node CNA and electrons in the substrate may move toward the second control node CNB.

Electrons may be generated in the substrate in response to the amount of incident light, and the generated electrons may move toward the second control node CNB, such that the electrons may be captured by the second detection node DNB adjacent to the second control node CNB. Therefore, electrons in the substrate may be used as signal carriers for detecting the amount of incident light.

In some implementations, the order of the first time period and the second time period may also be changed as necessary.

The circuit region 200 may include a plurality of elements for processing photocharges captured by the first and second detection nodes DNA and DNB and converting the photocharges into electrical signals. The circuit region 200 may include elements (e.g., transistors) disposed in the remaining regions other than the first tap TA and the second tap TB shown in the pixel PX shown in FIG. 2, and interconnect lines for electrical connection between the elements. A detailed description thereof will be given later with reference to the circuit diagram shown in FIG. 3. Control signals RST, TRG, FDG, and SEL applied to the plurality of elements may be supplied from the row driver 41. In addition, a pixel voltage (Vpx) may be a power-supply voltage (VDD).

Elements for processing photocharges captured by the first detection node DNA will hereinafter be described with reference to the attached drawings. The circuit region 200 may include a reset transistor RX_A, a transfer transistor TX_A, a first capacitor C1_A, a second capacitor C2_A, a floating diffusion (FD) transistor FDX_A, a drive transistor DX_A, and a selection transistor SX_A.

The reset transistor RX_A may be activated to enter an active state in response to a logic high level of the reset signal RST supplied to a gate electrode thereof, such that potential of the floating diffusion (FD) node FD_A and potential of the first detection node DNA may be reset to a predetermined level (i.e., the pixel voltage Vpx). In addition, when the reset transistor RX_A is activated (i.e., active state), the transfer transistor TX_A can also be activated (i.e., active state) to reset the floating diffusion (FD) node FD_A.

The transfer transistor TX_A may be activated (i.e., active state) in response to a logic high level of the transfer signal TRG supplied to a gate electrode thereof, such that charges accumulated in the first detection node DNA can be transmitted to the floating diffusion (FD) node FD_A.

The first capacitor C1_A may be coupled to the floating diffusion (FD) node FD_A, such that the first capacitor C1_A can provide predefined electrostatic capacity.

The second capacitor C2_A may be selectively coupled to the floating diffusion (FD) node FD_A according to operations of the floating diffusion (FD) transistor FDX_A, such that the second capacitor C2_A can provide additional predefined electrostatic capacity.

Each of the first capacitor C1_A and the second capacitor C2_A may be comprised of, for example, at least one of a Metal-Insulator-Metal (IM) capacitor, a Metal-Insulator-Poly silicon (IP) capacitor, a Metal-Oxide-Semiconductor (MOS) capacitor, and a junction capacitor.

The floating diffusion (FD) transistor FDX_A may be activated (i.e., active state) in response to a logic high level of the floating diffusion (FD) signal FDG supplied to a gate electrode thereof, such that the floating diffusion (FD) transistor FDX_A may couple the second capacitor C2_A to the floating diffusion (FD) node FD_A.

For example, the row driver 41 may activate the floating diffusion (FD) transistor FDX_A when the amount of incident light corresponds to a relatively high illuminance condition, such that the floating diffusion (FD) transistor FDX_A enters the active state and the floating diffusion (FD) node FD_A can be coupled to the second capacitor C2_A. As a result, when the amount of incident light corresponds to a high illuminance level, the floating diffusion (FD) node FD_A can accumulate much more photocharges therein, which can achieve a high dynamic range (HDR).

When the amount of incident light is at a relatively low illuminance level, the row driver 41 may control the floating diffusion (FD) transistor FDX_A to be deactivated (i.e., inactive state), such that the floating diffusion (FD) node FD_A can be isolated from the second capacitor C2_A.

In some other implementations, the floating diffusion (FD) transistor FDX_A and the second capacitor C2_A may be omitted as necessary.

A drain electrode of the drive transistor DX_A is coupled to the pixel voltage (Vpx) and a source electrode of the drive transistor DX_A is coupled to a vertical signal line SL_A through the selection transistor SX_A, such that a load (MOS) and a source follower circuit of a constant current source circuit CS_A coupled to one end of the vertical signal line SL_A can be constructed. Thus, the drive transistor DX_A may output a current corresponding to potential of the floating diffusion node FD_A coupled to a gate electrode thereof to the vertical signal line SL_A through the selection transistor SX_A.

The selection transistor SX_A may be activated (i.e., active state) in response to a logic high level of the selection signal SEL supplied to a gate electrode thereof, such that the pixel signal generated from the drive transistor DX_A can be output to the vertical signal line SL_A.

In order to process photocharges captured by the second detection node DNB, the circuit region 200 may include a reset transistor RX_B, a transfer transistor TX_B, a first capacitor C1_B, a second capacitor C2_B, a floating diffusion (FD) transistor FDX_B, a drive transistor DX_B, and a selection transistor SX_B. Whereas the elements for processing photocharges captured by the second detection node DNB have operation time points different from those of other elements for processing photocharges captured by the first detection node DNA, the elements for processing photocharges captured by the second detection node DNB may be substantially identical in structure and operation to the other elements for processing photocharges captured by the first detection node DNA, and as such a detailed description thereof will herein be omitted for convenience of description.

The pixel signal transferred from the circuit region 200 to the vertical signal line SL_A and the pixel signal transferred from the circuit region 200 to the vertical signal line SL_B may be processed by noise cancellation and analog-to-digital (ADC) conversion processing, such that each of the pixel signals can be converted into image data.

Although each of the reset signal RST, the transmission signal TRG, the floating diffusion (FD) signal FDG, and the selection signal SEL shown in FIG. 3 is denoted by one signal line, each of the reset signal RST, the transmission signal TRG, the floating diffusion (FD) signal FDG, and the selection signal SEL can be supplied through a plurality of signal lines (e.g., two signal lines), such that elements for processing photocharges captured by the first detection node DNA and the other elements for processing photocharges captured by the second detection node DNB can operate at different time points.

The image processor (not shown) may calculate image data acquired from photocharges captured by the first detection node DNA and other image data acquired from photocharges captured by the second detection node DNB, such that the image processor may calculate a phase difference using the calculated image data. The image processor may calculate depth information indicating the distance to the target object 1 based on a phase difference corresponding to each pixel, and may generate a depth image including depth information corresponding to each pixel.

Figure 4:
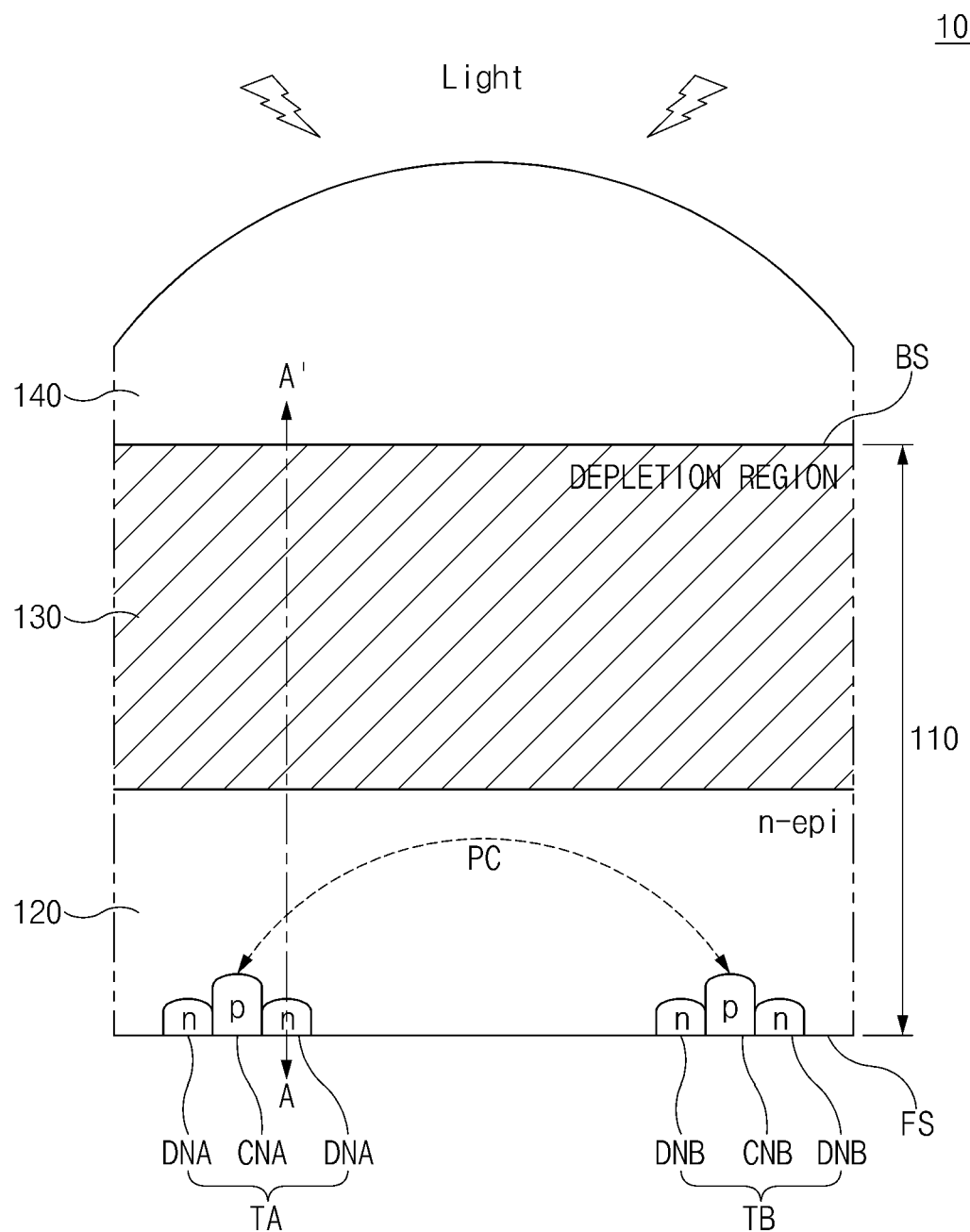
FIG. 4 is a schematic diagram illustrating an example of a photoelectric conversion region shown in FIG. 3 based on some implementations of the disclosed technology.
Figure 5:
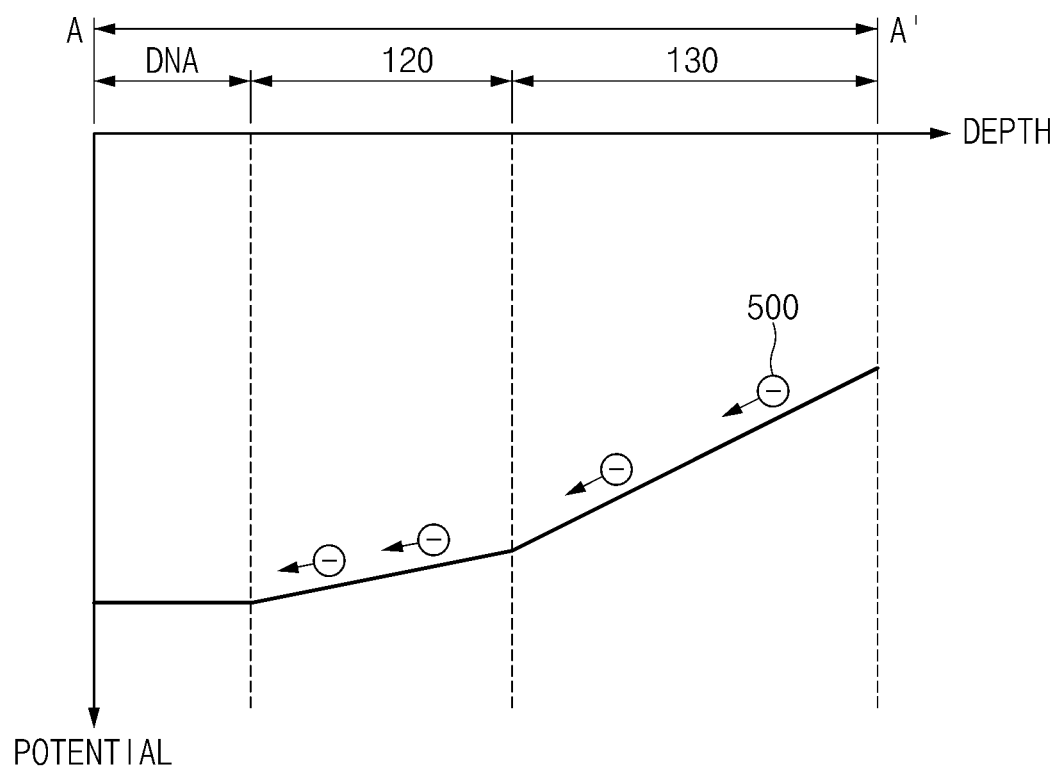
FIG. 5 is a graph illustrating an example of a potential distribution according to depths in the photoelectric conversion region shown in FIG. 4 based on some implementations of the disclosed technology.

FIG. 4 is a schematic diagram illustrating an example of the photoelectric conversion region shown in FIG. 3 based on some implementations of the disclosed technology. FIG. 5 is a graph illustrating an example of a potential distribution according to depths in the photoelectric conversion region shown in FIG. 4 based on some implementations of the disclosed technology.

Referring to FIG. 4, the photoelectric conversion region 100 may include a substrate 110 and a microlens 140.

The substrate 110 may be a semiconductor substrate, and may be formed by growing an N-type epitaxial layer on the P-type substrate. Thus, the substrate 110 may be formed using a combination of the epitaxial layer and the substrate having different types of conductivity.

The substrate 110 may include a front side (FS) and a back side (BS) that are arranged to face each other. Light, that is reflected from the target object 1 and is then incident upon the photoelectric conversion region 100, can be incident upon the substrate 110 through the back side (BS) of the substrate 110 after passing through the microlens 140. The substrate 110 may largely include an epitaxial layer (n-epi) disposed at or near the front side (FS), and a depletion region 130 disposed at or near the back side (BS).

The first tap TA including both the first control node CNA and the first detection node DNA and the second tap TB including both the second control node CNB and the second detection node DNB may be formed in the epitaxial layer 120. The first tap TA and the second tap TB have already been disclosed in FIGS. 2 and 3, and as such redundant description thereof will herein be omitted for brevity.

The epitaxial layer 120 may be doped with impurities such as N-type impurities to produce electrons that are capable of operating as charge carriers used as majority carriers. The first tap TA and the second tap TB, that are used to generate the pixel current PC, are disposed in the epitaxial layer 120 doped with N-type impurities other than P-type impurities, so that power consumed in the entire pixel array 30 can be reduced.

Each of the first control node CNA of the first tap TA and the second control node CNB of the second tap TB is doped with P-type impurities, a depletion region may be formed between the first control node CNA and the epitaxial layer 120, and may also be formed between the second control node CNB and the epitaxial layer 120. Due to the above-mentioned depletion regions, resistance between the first control node CNA and the epitaxial layer 120 and resistance between the second control node CNB and the epitaxial layer 120 may relatively increase as compared to the other case in which no depletion region exists. Since resistance between the first control node CNA and the second control node CNB may include resistance between the first control node CNA and the epitaxial layer 120 and resistance between the second control node CNB and the epitaxial layer 120, resistance between the first control node CNA and the second control node CNB may also increase due to presence of such depletion region.

The magnitude of the pixel current PC may be proportional to a voltage difference between the activation voltage (i.e., active voltage) and the deactivation voltage (i.e., inactive voltage), and may be inversely proportional to resistance between the first control node CNA and the second control node CNB. Assuming that a voltage difference is fixed and the depletion region exists, the magnitude of the pixel current PC may decrease due to the increasing resistance between the first control node CNA and the second control node CNB. As a result, power consumption corresponding to a product of the pixel current PC and the voltage difference may decrease.

In order to reduce power consumption, the epitaxial layer, which has a relatively higher resistivity while being doped with P-type impurities, can be used without using the other epitaxial layer doped with P-type impurities. However, as resistivity of the epitaxial layer contacting transistors included in each pixel increases, characteristics of the transistors may be changed, such that tuning of the transistors may be required again.

In case that the epitaxial layer 120 is doped with the N-type impurities other than P-type impurities and has the same resistivity, it is possible to reduce power consumption only through the formation of the depletion region without additional tuning operation of the transistors.

When the activation voltage is applied to the first control node CNA and the deactivation voltage is applied to the second control node CNB, or when the deactivation voltage is applied to the first control node CNA and the activation voltage is applied to the second control node CNB, the electric field may be formed between the first control node CNA and the second control node CNB, such that the pixel current PC by which electrons acting as majority carriers of the epitaxial layer 120 are moving may flow in the pixel. Although FIG. 4 illustrates only one path for the pixel current PC for convenience of description, the pixel current PC may flow between the first control node CNA and the second control node CNB through various paths formed in the epitaxial layer 120

The epitaxial layer 120, the first tap TA, and the second tap TB may be disposed to be in contact with or near the front side (FS) of the substrate 110.

The depletion region 130 may be formed by a PN junction between the P-type substrate and the N-type epitaxial layer. In this case, the P-type substrate and the N-type epitaxial layer may not be identical in concept to the substrate 110 and the epitaxial layer 120. A substrate, which is formed by removing a region having carriers from the P-type substrate on which the N-type epitaxial layer is grown, may refer to the substrate 110. In addition, a region, which is formed by removing the depletion region 130 from the N-type epitaxial layer, may refer to the epitaxial layer 120. A detailed description of the method for forming the substrate 110 will be given later with reference to FIGS. 8A to 8F.

As the N-type epitaxial layer is grown on the P-type substrate, carriers may disappear in the vicinity of a boundary between the P-type substrate and the N-type epitaxial layer by a PN junction. Here, the depletion region 130 may refer to the region in which such carriers disappear.

One side of the depletion region 130 may be in contact with or near the back side (BS) of the substrate 110, and the other side of the depletion region 130 may be in contact with the epitaxial layer 120. Therefore, the region having P-type impurities may be disposed not only over the depletion region 130, but also between the depletion region 130 and the microlens 140.

The depletion region 130 may have a predetermined depth from the back side (BS) of the substrate 110. The depth of the depletion region 130 may be adjusted by a difference in impurity doping density between the P-type substrate and the N-type epitaxial layer. In other words, the depletion region 130 may be formed in the substrate 110 to a desired depth using a difference in impurity doping density between the P-type substrate and the N-type epitaxial layer. For example, the depth of the depletion region 130 may be about 4 µm or less.

Since carriers capable of acting as charge carriers disappear from the depletion region 130, the depletion region 130 may not include such carriers. Therefore, whereas the pixel current PC can flow through the epitaxial layer 120, it is impossible for the pixel current PC to flow through the depletion region 130. As a result, the amount of the pixel current PC may be reduced as compared to the case in which the depletion region 110 does not exist, and the amount of power consumed in the pixel array 30 can also be reduced.

In the depletion region 130 and the epitaxial layer 120, light reflected from the target object 1 may be incident upon the depletion region 130 and the epitaxial layer 120, thereby generating photocharges.

FIG. 5 is a graph illustrating an example of potential distribution according to depths from the front side (FS) in the photoelectric conversion region 100 taken along the line A-A' shown in FIG. 4 based on some implementations of the disclosed technology. In FIG. 5, it is assumed that the second control node CNB receives the activation voltage as an input and the first control node CNA receives the deactivation voltage as an input, and the pixel current PC flows from the second control node CNB to the first control node CNA.

The first detection node DNA, the epitaxial layer 120, and the depletion region 130 may be sequentially disposed in the direction from the point (A) of the front side (FS) to the other point (A') of the back side (BS).

The first detection node DNA may have the lowest potential. In some implementations, the first detection node DNA may receive a predetermined detection voltage to maintain the lowest potential.

The epitaxial layer 120 may have a higher potential than the first detection node DNA. The epitaxial layer 120 may have a lower potential as the distance to the first detection node DNA becomes shorter due to the influence of the pixel current PC. In some implementations, when the first detection node DNA receives a predetermined detection voltage as an input, a potential gradient of the epitaxial layer 120 may increase.

The depletion region 130 may have a higher potential than the epitaxial layer 120. The depletion region 130 may have a relatively stronger negative (−) polarity as the distance to the epitaxial layer 120 becomes shorter due to a PN junction. As a result, as the distance from the backside (BS) of the substrate 110 to the epitaxial layer 120 becomes shorter, the depletion region 130 may have a lower potential.

The potential gradient of the depletion region 130 according to depths in the photoelectric conversion region 100 can be adjusted by a difference in impurity doping density between the P-type substrate and the N-type epitaxial layer. In some implementations, it is assumed that the potential gradient of the depletion region 130 is higher than the potential gradient of the epitaxial layer 120.

Photocharges 500 generated in the depletion region 130 may be accelerated and moved in the direction of the epitaxial layer 120 by the potential gradient of the depletion region 130. The photocharges 500 having reached the epitaxial layer 120 may move along flow of the pixel current PC, such that the photocharges 500 can be captured by the first detection node DNA. The photocharges 500 generated in the epitaxial layer 120 may also move along flow of the pixel current PC, such that the photocharges 500 can be captured by the first detection node DNA.

Referring back to FIG. 4, the microlens 140 may be formed over the substrate 110, and may increase light gathering power of incident light, resulting in increased light reception (Rx) efficiency of the substrate 110. Although not shown in the drawings, at least one of an anti-reflection layer for reducing the intensity of light reflected from the back side (BS) of the substrate 110 and an optical filter layer for selectively transmitting a specific wavelength band of light may be disposed between the microlens 140 and the substrate 110.

Figure 6:
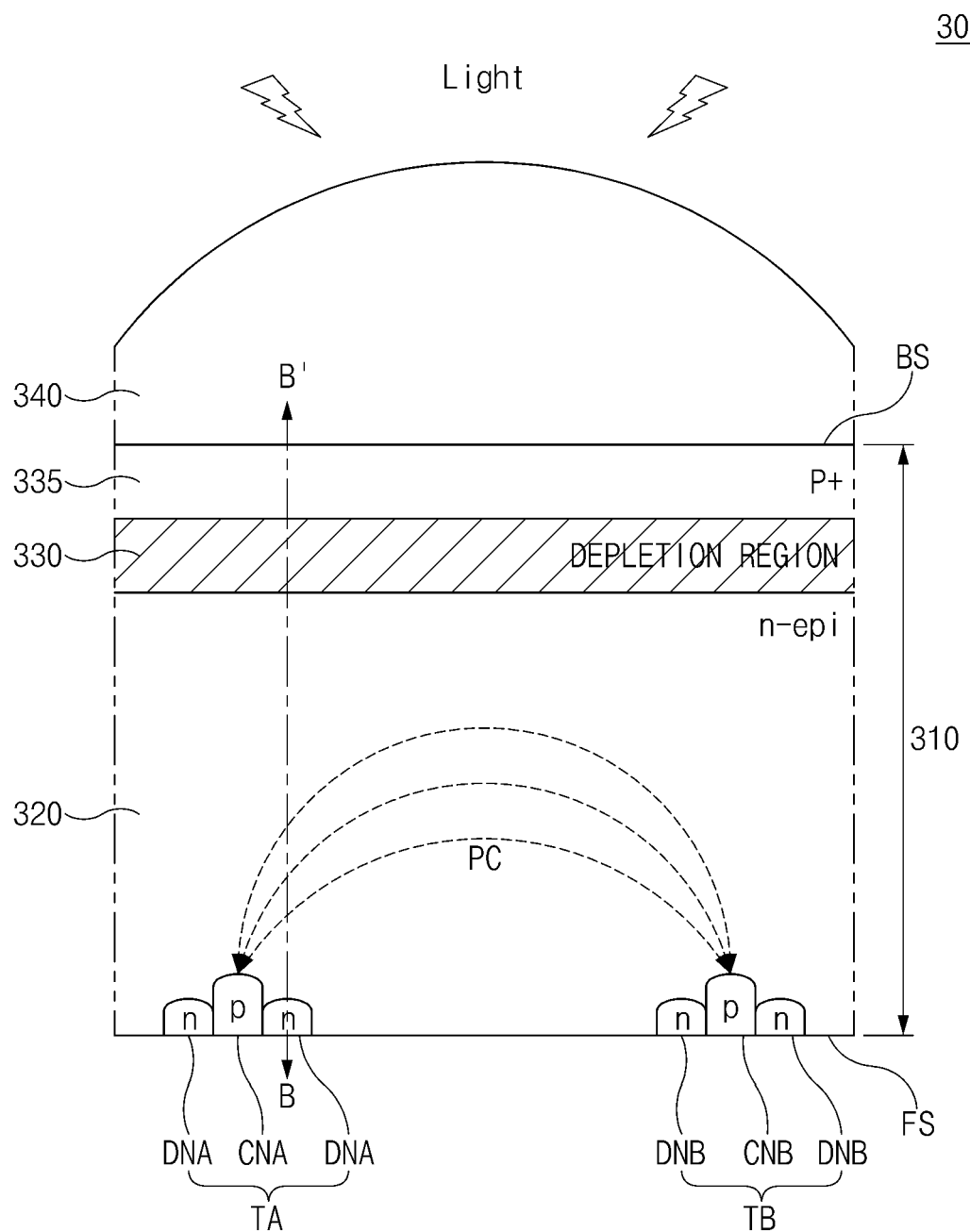
FIG. 6 is a schematic diagram illustrating a comparison example of the photoelectric conversion region shown in FIG. 4 based on some implementations of the disclosed technology.
Figure 7:
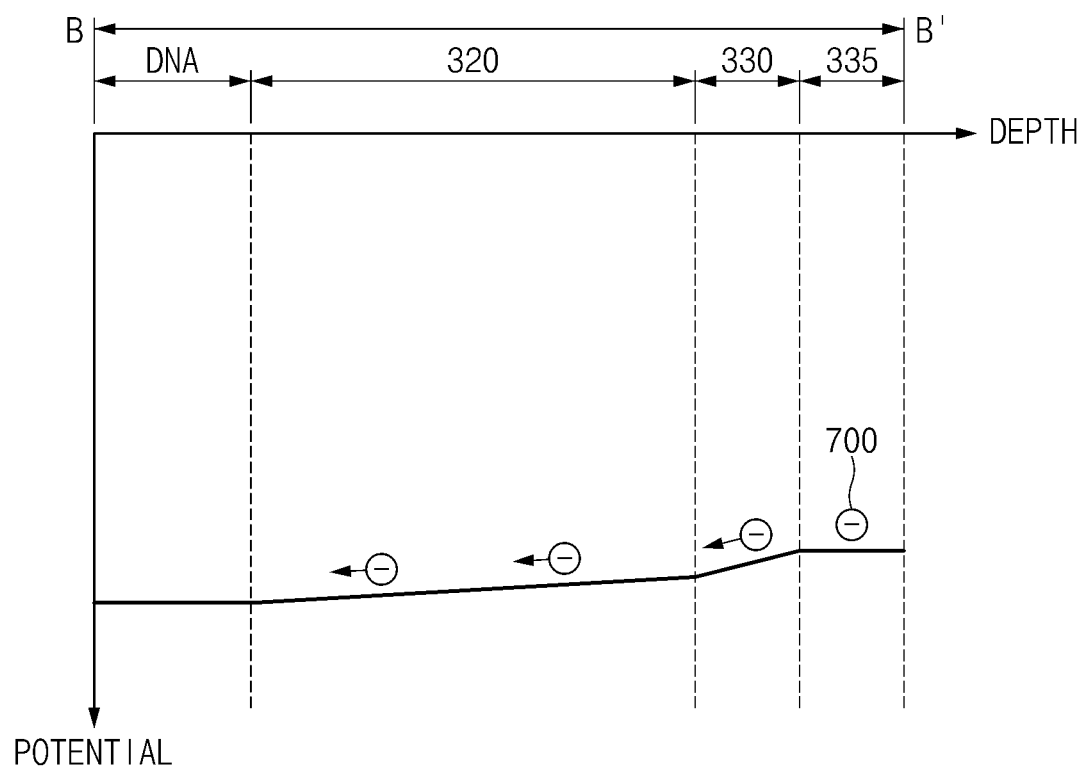
FIG. 7 is a graph illustrating an example of a potential distribution according to depths in the photoelectric conversion region shown in FIG. 6 based on some implementations of the disclosed technology.

FIG. 6 is a schematic diagram illustrating a comparison example of the photoelectric conversion region shown in FIG. 4 based on some implementations of the disclosed technology. FIG. 7 is a graph illustrating an example of a potential distribution according to depths in the photoelectric conversion region shown in FIG. 6 based on some implementations of the disclosed technology.

FIG. 6 is a cross-sectional view illustrating the photoelectric conversion region 300 having characteristics that are different from those of the photoelectric conversion region 100.

The photoelectric conversion region 300 may include a substrate 310 and the microlens 340. The remaining components of the photoelectric conversion region 300 other than some structures different from those of the photoelectric conversion region 100 shown in FIG. 4 may be substantially identical in structure to the photoelectric conversion region 100 shown in FIG. 4, and as such redundant description thereof will herein be omitted for brevity. For convenience of description, the photoelectric conversion region 300 shown in FIG. 6 will herein after be described centering upon characteristics different from those of the photoelectric conversion region 100 shown in FIG. 4.

The substrate 310 may be formed by growing the N-type epitaxial layer on the N-type substrate. In other words, the substrate 310 may be formed using a combination of the epitaxial layer and the substrate having the same type of conductivity.

The substrate 310 may include a front side (FS) and a back side (BS) that are arranged to face each other. The substrate 310 may include an epitaxial layer 320 disposed at or near the front side (FS), a P$^+$ impurity region (P$^+$) 335 disposed at or near the back side (BS), and a depletion region 330 disposed between the epitaxial layer 320 and the P$^+$ impurity region (P$^+$) 335.

The first tap TA including both the first control node CNA and the first detection node DNA and the second tap TB including both the second control node CNB and the second detection node DNB may be formed in the epitaxial layer 320. The first tap TA and the second tap TB have already been disclosed in FIGS. 2 and 3, and as such redundant description thereof will herein be omitted for brevity.

The depletion region 330 may be formed by a PN junction between the N-type epitaxial layer and a P$^+$ conductive ion implantation region. Here, the P$^+$ conductive ion implantation region may be formed by implanting ions into the N-type epitaxial layer. In this case, the N-type epitaxial layer and the ion implantation region may have concepts different from those of the epitaxial layer 320 and the P$^+$ impurity region 335. The region other than the depletion region 330 in the N-type epitaxial layer may correspond to the epitaxial layer 320. The region other than the depletion region 330 in the ion implantation region may correspond to the P$^+$ impurity region 335.

The P$^+$ impurity region 335 may be formed by implanting P-type impurities having a relatively higher density into the substrate 310 through ion implantation. The P$^+$ impurity region 335 may prevent a dark current from occurring in or near the back side (BS) of the substrate 310, may adjust a potential of the back side (BS), and may thus implement a potential gradient in the direction of the detection nodes DNA and DNB.

FIG. 7 is a graph illustrating an example of a potential distribution according to depths from the front side (FS) in the photoelectric conversion region 300 taken along the line B-B' shown in FIG. 6 based on some implementations of the disclosed technology. In FIG. 7, it is assumed that the second control node CNB receives the activation voltage as an input and the first control node CNA receives the deactivation voltage as an input, and the pixel current PC flows from the second control node CNB to the first control node CNA.

The first detection node DNA, the epitaxial layer 320, the depletion region 330, and the P$^+$ impurity region 335 may be sequentially disposed in the direction from the point (B) of the front side (FS) to the other point (B') of the back side (BS).

The first detection node DNA may have the lowest potential.

The epitaxial layer 320 may have a lower potential as the distance to the first detection node DNA becomes shorter due to the influence of the pixel current PC.

The depletion region 330 may have a relatively stronger negative (−) polarity as the distance to the epitaxial layer 320 becomes shorter due to a PN junction. As a result, as the distance to the epitaxial layer 320 becomes shorter, the depletion region 330 may have a lower potential.

In the meantime, the potential of the $P^+$ impurity region 335 may be higher than the depletion region 330, and may have a constant potential regardless of the depth.

Photocharges 700 generated in the $P^+$ impurity region 335 having a constant potential with respect to the depth may not be transferred to the depletion region 330. Photocharges 700 generated in the depletion region 330 may be accelerated and moved in the direction of the epitaxial layer 320 by the potential gradient of the depletion region 330. The photocharges 700 having reached the epitaxial layer 320 may move along flow of the pixel current PC, such that the photocharges 700 can be captured by the first detection node DNA. The photocharges 700 generated in the epitaxial layer 320 may also move along flow of the pixel current PC, such that the photocharges 700 can be captured by the first detection node DNA.

Since the depletion region 330 is formed by a PN junction between the N-type epitaxial layer and the $P^+$ conductive ion implantation region, it may be difficult for the ion implantation region to be formed in a vertically large region at a deep position from the back side (BS) due to mechanical limitations of ion implantation devices. As a result, the ion implantation region has only to be formed vertically in a small region at a relatively shallower position than the depletion region 130 formed by the PN junction between the N-type epitaxial layer and the P-type substrate.

Therefore, as can be seen from FIG. 6, the epitaxial layer 320 may have a relatively larger region than the epitaxial layer shown in FIG. 4, and the pixel current PC may flow through many more paths. As a result, the amount of the pixel current PC shown in FIG. 6 may increase as compared to FIG. 4, and the amount of power consumed in the pixel array 30 may also increase.

As can be seen from FIG. 7, the depletion region 330 configured to accelerate photocharges 700 in the direction of the epitaxial layer 320 by the potential gradient may be formed in a relatively smaller region, such that photocharge acceleration capability of each pixel may decrease. In contrast, in the photoelectric conversion region 100 in which the depletion region 130 is formed in a relatively large region, photocharge acceleration capability of each pixel may increase.

The photocharge acceleration capability may refer to the capability to rapidly move photocharges generated in each pixel to the corresponding detection node. As the photocharge acceleration capability becomes higher, demodulation contrast indicating the capability to capture photocharges in the corresponding time period may also increase. As a result, the image sensing device can operate at a higher speed.

Since the ion implantation region for forming the depletion region 330 and the $P^+$ impurity region 335 is formed by ion implantation, a dangling bond causing an implant damage may increase in the back side (BS) of the substrate 310, or may increase in a boundary (i.e., a PN junction surface) between the ion implantation region and the N-type epitaxial layer. The dangling bond may interfere with normal movement of photocharges by increasing a dark current. In order to reduce such implant damage, an annealing process should be additionally performed, such that a total fabrication process may become complicated, resulting in increase in production costs.

On the other hand, since the depletion region 130 shown in FIG. 4 may be formed without using the ion implantation process, the implant damage may not occur and the additional annealing process may not be required. The dangling bond capable of being present in or near a surface (i.e., back side BS) of the depletion region 130 can be mostly cured by the annealing process performed on the front side (FS).

In association with the depletion region 330 and the $P^+$ impurity region 335 that are formed by the ion implantation process, unexpected limitations may occur in the ion implantation process, such that uniformity problems in which characteristics of the respective regions are changed according to in-wafer positions (i.e., in-wafer zones, for example, the center position or the edge position) may occur in the depletion region 330 and the $P^+$ impurity region 335. In association with the other depletion region 130 formed through epitaxial growth on the P-type substrate in a wafer state, uniformity problems in which characteristics of the respective regions are changed depending on in-wafer positions may hardly occur in the depletion region 130.

Some parts of photocharges (electrons) generated by the $P^+$ impurity region 335 and the depletion region 330 may be coupled to holes acting as majority carriers of the $P^+$ impurity region 335, such that the coupled photocharges (electrons) may disappear or be lost. Therefore, photoelectric conversion efficiency of the photoelectric conversion region 300 may be degraded, resulting in deterioration in signal characteristics.

In contrast, as the substrate 110 shown in FIG. 4 does not include the region corresponding to the P-type region 335, the above-mentioned problems in which photocharges (electrons) generated by the depletion region 130 are lost may not occur.

As described above, photocharges (electrons) generated by the $P^+$ impurity region 335 may be lost in the $P^+$ impurity region 335, or may not be transferred to the detection node due to absence of a potential gradient. On the other hand, in FIG. 4, the depletion region 130 may be disposed at a specific position corresponding to the $P^+$ impurity region 335, and photocharges (electrons) generated by the depletion region 130 may rapidly move toward the detection node due to the potential gradient of the depletion region 130.

In other words, assuming that the substrate 110 shown in FIG. 4 and the substrate 310 shown in FIG. 6 have the same depth (i.e., the distance between the front side FS and the back side BS), the region (i.e., the region in which photocharges capable of being captured by the detection node are generated) capable of collecting photocharges (electrons) in FIG. 4 may be larger in size than that of FIG. 6, resulting in an increase in photoelectric conversion efficiency.

FIGS. 8A to 8F are cross-sectional views illustrating processes for forming the photoelectric conversion region shown in FIG. 4 based on some implementations of the disclosed technology.

FIGS. 8A to 8F show the process for forming the photoelectric conversion region contained in one pixel. The substantially same process can also be applied to other pixels contained in the pixel array 30 and also another pixel array belonging to the same wafer as the pixel array 30. Although FIGS. 8A to 8F show processes performed in a wafer state, other implementations are also possible.

Figure 8A:
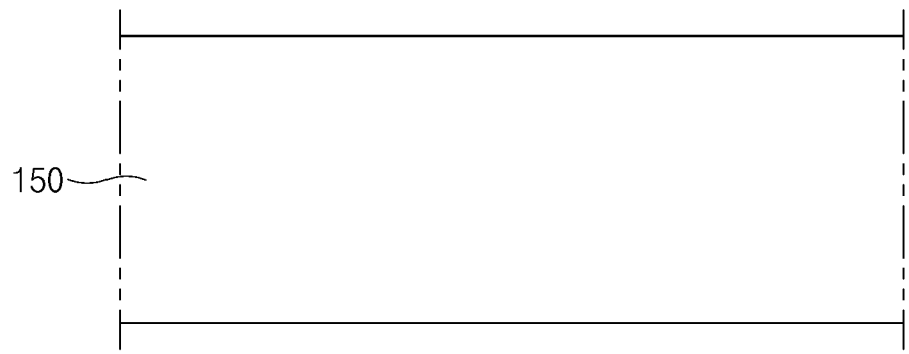
FIGS. 8A to 8F are cross-sectional views illustrating processes for forming the photoelectric conversion region shown in FIG. 4 based on some implementations of the disclosed technology.

In step S10 shown in FIG. 8A, a P-type substrate 150 may be provided.

Figure 8B:
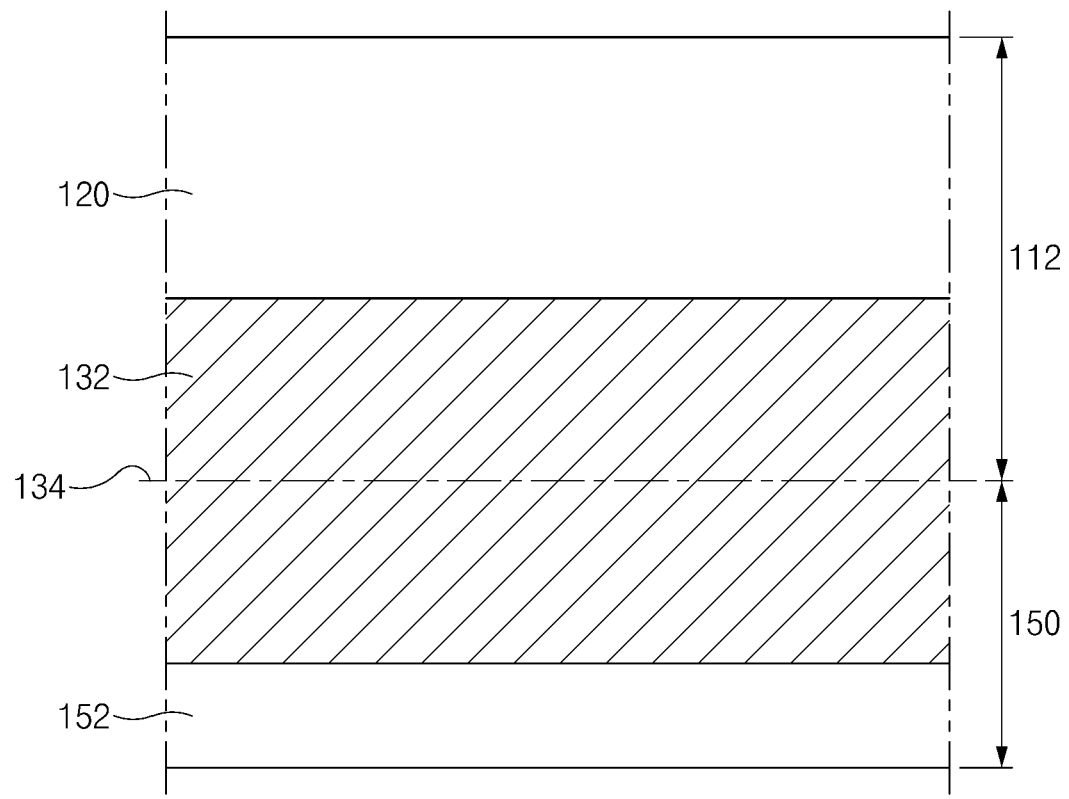

In step S20 shown in FIG. 8B, an N-type epitaxial layer 112 may be grown on the P-type substrate 150. A boundary between the P-type substrate 150 and the N-type epitaxial layer 112 may be a PN junction surface 134, and an initial depletion region 132 may be formed by a PN junction between the P-type substrate 150 and the N-type epitaxial layer 112. The depth of the initial depletion region 132 may be determined by impurity doping densities of the P-type substrate 150 and the N-type epitaxial layer 112.

In the N-type epitaxial layer 112, the region other than the initial depletion region 132 may be defined as the epitaxial layer 120. In the P-type substrate 150, the region other than the initial depletion region 132 may be defined as a P-type region 152.

Figure 8C:
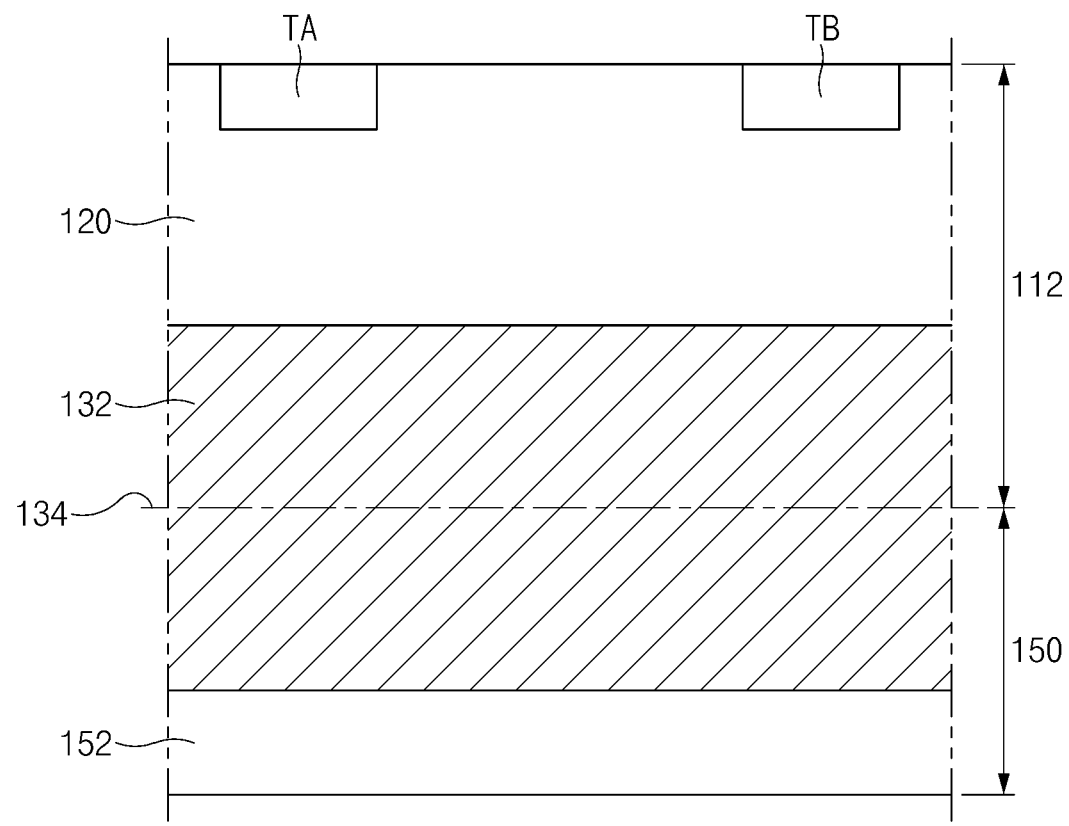

In step S30 shown in FIG. 8C, the ion implantation process and the annealing process for forming the first tap TA and the second tap TB in the N-type epitaxial layer 112 may be performed.

Figure 8D:
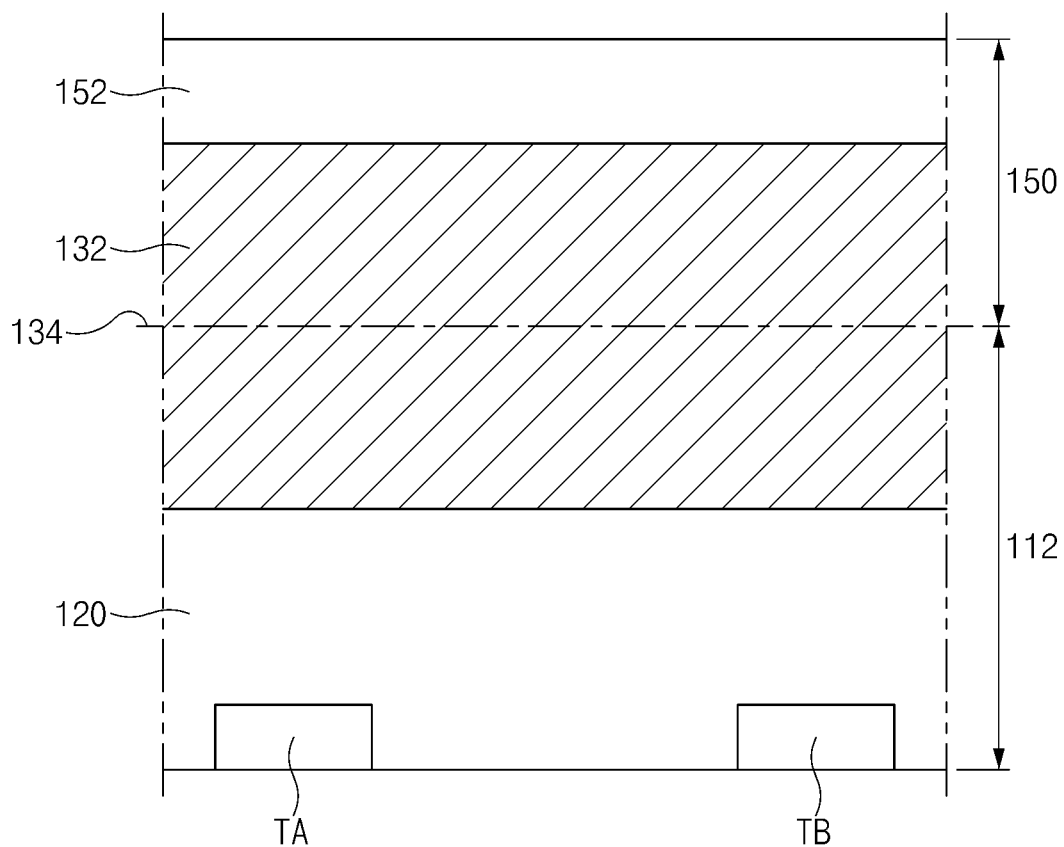

In step S40 shown in FIG. 8D, the wafer including the P-type substrate 150 and the N-type epitaxial layer 112 may be turned over, so that it may be possible to prepare for the backside process. Step S20 shown in FIG. 8B and Step S30 shown in FIG. 8C may be performed on the front side (FS) of the substrate 110, so that each of steps S20 and S30 may be considered to be a frontside (FS) process. Since fabrication steps from step S50 may be performed on the back side (BS) of the substrate 110, the above fabrication steps can be defined as backside (BS) processes.

Figure 8E:
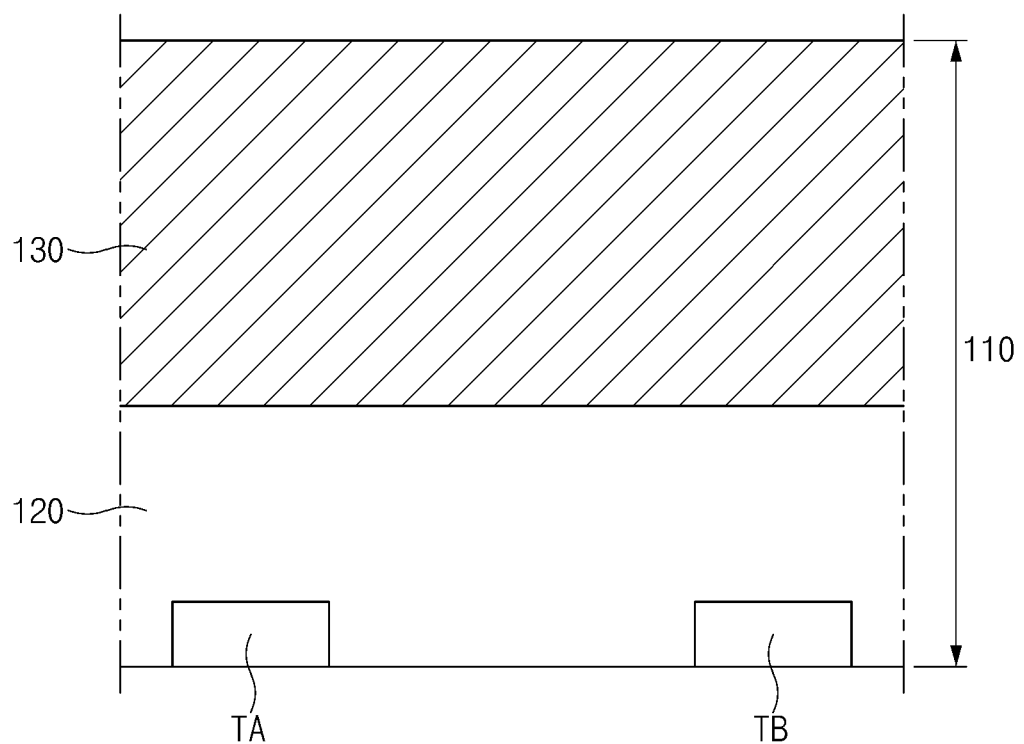

In step S50 shown in FIG. 8E, the P-type region 152 may be removed by an etching process (e.g., wet etching), the surface on which the etching process is performed may be planarized through a chemical mechanical polishing (CMP) process, resulting in formation of the substrate 110. In this case, the etching process may be performed in a manner that the P-type region 152 is completely removed and the initial depletion region 132 is etched and CMP-processed to have a predetermined depth, resulting in formation of the depletion region 130. For example, although the back side (BS) of the substrate 110 and the PN junction surface 134 can be identical to each other after the etching process and the CMP process are performed on the PN junction surface 134, other implementations are also possible. Thus, the distance between the backside (BS) of the substrate 110 and the front side (FS) of the substrate 110 may be longer or shorter than the distance between the PN junction surface 134 and the front side (FS) of the substrate 110.

Since impurities of the P-type substrate are different from impurities of the N-type substrate, there is a need for different types of etchants for removing the substrate to be applied to the P-type substrate and the N-type substrate. Since the image sensing device based on some implementations of the disclosed technology is configured to use a combination of the P-type substrate and the N-type epitaxial layer, the etchant used in the combination of the P-type substrate and the P-type epitaxial layer can be used without any change, such that convenience in fabrication can increase and costs associated with etchants can be reduced.

Figure 8F:
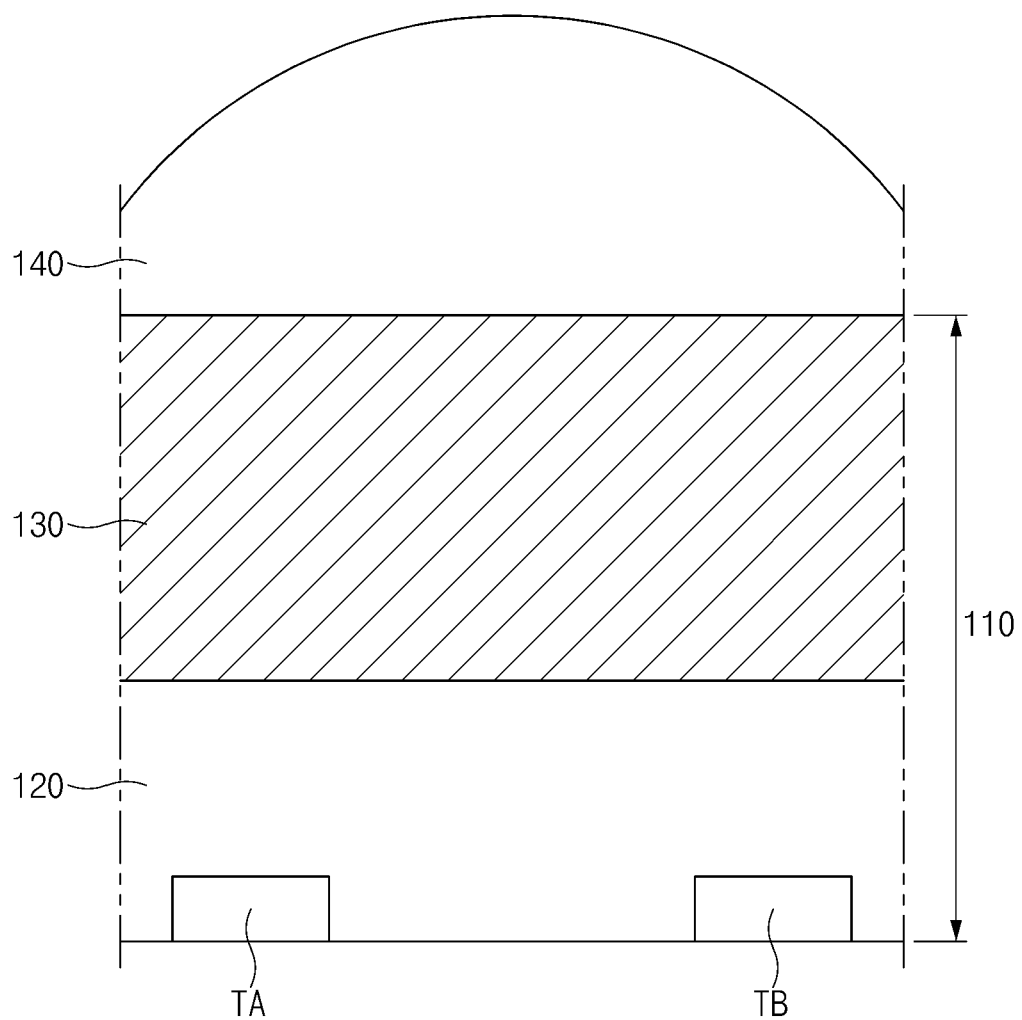

In step S60 shown in FIG. 8F, a deposition process and an etching process may be performed on the back side (BS) of the substrate 110, such that the microlens 140 having a predetermined curvature can be formed.

As is apparent from the above description, the image sensing device based on some implementations of the disclosed technology can improve performance of a Time of Flight (TOF) pixel while simultaneously reducing power consumption of the Time of Flight (TOF) pixel.

The embodiments of the disclosed technology may provide a variety of effects or benefits that may be directly or indirectly achieved in various implementations of the disclosed technology in this patent document.

Although a number of illustrative embodiments have been described, it should be understood that numerous modifications or variations to the disclosed embodiments and other embodiments can be devised based on what is described and/or illustrated in this patent document.

What is claimed is:

1. An image sensing device, comprising:
    a substrate including a front side and a back side that are opposite to each other, wherein the image sensing device is structured to operate by receiving incident light through the back side of the substrate;
    a depletion region disposed in the substrate to be in contact with the back side of the substrate;
    an epitaxial layer disposed in the substrate to be in contact with or near the front side of the substrate; and
    a plurality of detection structures disposed in the epitaxial layer, each configured to capture photocharge generated by incident light and move by a current flowing in the epitaxial layer,
    wherein each of the plurality of detection structures includes a control node including P-type impurities and a detection node including N-type impurities, and
    wherein the epitaxial layer includes the N-type impurities.

2. The image sensing device according to claim 1, wherein:
    the depletion region and the epitaxial layer are in contact with each other.

3. The image sensing device according to claim 1, wherein:
    a potential of the depletion region is gradually lowered as a distance from the back side of the substrate to the epitaxial layer becomes shorter.

4. The image sensing device according to claim 3, wherein:
    photocharges generated by the depletion region move to the epitaxial layer.

5. The image sensing device according to claim 1, wherein:
    the depletion region has a higher potential than a potential of the epitaxial layer.

6. The image sensing device according to claim 1, wherein the current flows in the epitaxial layer only while not flowing in the depletion region.

7. The image sensing device according to claim 1, wherein:
    each of the plurality of detection structures is arranged to be in contact with the front side of the substrate.

8. The image sensing device according to claim 1, wherein:
    the control node is configured to receive a demodulation control signal for generating the current.

9. The image sensing device according to claim 8, wherein:
    the detection node for capturing the photocharge is disposed to surround the control node.

10. The image sensing device according to claim 1, further comprising:
    a microlens disposed over the depletion region, and configured to converge the incident light and apply a converged light to the substrate.

11. An image sensing device, comprising:
a depletion region having a first side and a second side that are opposite to each other, wherein light is incident on the first side of the depletion region; and
an epitaxial layer disposed to be contact with the second side of the depletion region and comprising:
1) A plurality of control nodes configured to respectively receive different control signals and generate a current due to a difference between the different control signals; and
2) A plurality of detection nodes disposed to respectively correspond to the plurality of control nodes, each configured to capture photocharges that are generated by incident light and move by the current,
wherein the plurality of control nodes include P-type impurities,
wherein plurality of detection nodes include N-type impurities, and
wherein the epitaxial layer is doped with the N-type impurities.

12. The image sensing device according to claim 11, further comprising:
a microlens disposed on the first side of the depletion region, and configured to converge the incident light and to apply an converged light to the depletion region.

13. The image sensing device according to claim 12, wherein:
a region between the microlens and the depletion region is free of the P-type impurities.

14. The image sensing device according to claim 11, wherein:
the current flows through the epitaxial layer.

15. The image sensing device according to claim 11, wherein:
a potential of the depletion region is gradually lowered as a distance from the first side of the depletion region to the epitaxial layer becomes shorter.

16. The image sensing device according to claim 15, wherein:
photocharges move from the depletion region to the epitaxial layer.

* * * * *